United States Patent
Park

(10) Patent No.: US 7,355,488 B2
(45) Date of Patent: Apr. 8, 2008

(54) DIFFERENTIAL AMPLIFIER FOR USE IN RING OSCILLATOR

(75) Inventor: Kwang-Il Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 11/453,495

(22) Filed: Jun. 15, 2006

(65) Prior Publication Data
US 2007/0040622 A1 Feb. 22, 2007

(30) Foreign Application Priority Data
Aug. 16, 2005 (KR) .................. 10-2005-0074666

(51) Int. Cl.
*H03K 3/03* (2006.01)
(52) U.S. Cl. .................. 331/57; 331/108 A; 327/266; 327/274; 327/280; 327/287
(58) Field of Classification Search .......... 331/57, 331/108 A; 327/266, 274, 280, 287
See application file for complete search history.

(56) References Cited

U.S. PATENT DOCUMENTS

| | | | |
|---|---|---|---|
| 5,673,008 A * | 9/1997 | Sumita ............... | 331/57 |
| 5,994,939 A * | 11/1999 | Johnson et al. ........ | 327/280 |
| 6,304,149 B1 * | 10/2001 | Kim .................. | 331/57 |
| 6,861,911 B2 * | 3/2005 | Hwang et al. .......... | 331/57 |
| 6,943,608 B2 * | 9/2005 | Kelkar ................ | 327/274 |
| 2003/0030498 A1 | 2/2003 | Eatock ................ | 331/57 |
| 2006/0267659 A1 * | 11/2006 | Tsai et al. ............. | 327/280 |

* cited by examiner

*Primary Examiner*—Benny Lee
*Assistant Examiner*—Levi Gannon
(74) *Attorney, Agent, or Firm*—Mills & Onello LLP

(57) ABSTRACT

A differential amplifier circuit for use in a ring oscillator includes first and second MOS transistors to each source of which an operating power source voltage is applied, and which individually respond to first and second input signals with mutually contrary phases applied to gates thereof; cross-coupled first and second-stage transistors of which each drain-source channel is connected between each drain of the first and second MOS transistors and a ground voltage level; a first variable resistance, which is connected between a drain of the first MOS transistor cross-connected to a second gate of the cross-coupled second-stage transistors, and a first gate of the cross-coupled first-stage transistors, and which is controlled by the operating power source voltage applied to a gate thereof; and a second variable resistance, which is connected between a drain of the second MOS transistor cross-connected to a second gate of the cross-coupled first-stage transistors, and a first gate of the cross-coupled second-stage transistors, and which is controlled by the operating power source voltage applied to a gate thereof. Accordingly, the ring oscillator can ensure a greater resonance frequency range as compared with the conventional oscillator, and, at the same time, jitter characteristics are improved.

14 Claims, 3 Drawing Sheets

DIFFERENTIAL AMPLIFIER FOR USE IN RING OSCILLATOR

RELATED APPLICATIONS

This application claims priority to Korean Patent Application No. 10-2005-074666, filed Aug. 16, 2005, the contents of which are hereby incorporated herein by reference in their entirety.

TECHNICAL FIELD OF THE INVENTION

The present invention relates to a ring oscillator for use in a semiconductor memory device such as a DRAM etc., and more particularly, to a ring oscillator that operates at a low power level that is configured with cross-coupled differential amplifiers of two or more stages.

BACKGROUND OF THE INVENTION

A phase-locked loop (PLL) generally includes a voltage control oscillator (VCO), a phase frequency detector (PFD), a frequency divider, a charge pump and a loop filter, and has a phase-locking function for locking the output signal of the VCO to a reference input signal. All components influence the performance of the overall circuit, but the VCO is the element that decides the operating frequency of the PLL; thus the VCO is most influential on PLL performance. That is, the highest and lowest frequencies of the VCO restrict the tuning range of frequency in the PLL. In addition, the change in output magnitude of the VCO within the tuning range should be substantially minimized, and jitter noise should be also substantially reduced.

In the VCO, a typical ring oscillator is configured with an inverter chain in which terminals are connected in series, and a final output terminal in the chain is connected to the first input terminal. In another configuration, the VCO is configured in a differential amplifier type in which a final output is cross-fed to an input and includes a configuration of even-number stages.

In an inverter chain type ring oscillator, an inverter having a simplified structure is used as a delay element; thus power consumption is relatively low and, at the same time, a high oscillation frequency can be obtained. However, when the oscillation frequency of ring oscillator is increased, influence from a variation in operating temperature, a variation in power source voltage, and a variation in process parameters, is increased. A differential amplifier type ring oscillator, on the other hand, has a relatively complicated configuration, but is strongly isolated from the influence of external noise.

In the inverter chain type ring oscillator, the principle of the oscillation operation is closely related to the inverting function and the delay function as characteristics of inverters. For example, in configuring a ring oscillator with an odd number of inverter stages, when an input of logic 1 is applied to a first stage, an output of the first stage becomes logic 0 after a lapse of a given delay time, and again after a lapse of given delay time, an output of second stage becomes logic 1. Thus, if the propagation delay time of an inverter is Td and the ring oscillator includes N inverters, N being an odd number; the time elapsed when an inverted signal of a first input is applied again as a first input, becomes NTd, and signals of the ring oscillator represented by repeating cycles of the above procedure become periodic signals. That is, an oscillation period of a ring oscillator having N inverters with a delay time of Td, becomes 2NTd.

To realize a ring oscillator constructed of differential amplifiers based on an even number of stages, an input of the first stage and an output of the final stage are cross-connected with each other. When logic signals of 1 and 0 are each input to an input terminal of first differential amplifier, output signals of the final stage become logic 0 and logic 1. At this time, the output of the final stage is also connected to an input of the first stage, thus in a differential ring oscillator constructed of the N-number of differential amplifiers, N being an even number, an input of first differential amplifier is inverted after a lapse of NTd. Then, an oscillation period of differential ring oscillator constructed of N even-number stages becomes 2NTd as in the case of the ring oscillator of odd-number of stages.

A conventional ring oscillator employed in a semiconductor memory device such as a DRAM (Dynamic Random Access Memory) etc. has a period that varies greatly in response to variations in the power source voltage Vcc level and temperature level. In particular, the period is reduced in a high voltage (high Vcc) or low temperature environment, and is increased in a low voltage (low Vcc) or high temperature environment. Such a ring oscillator may be used in the DRAM to control a refresh period of the device.

A conventional ring oscillator circuit is described as follows. Recently, a ring oscillator PLL has become popular by employing a differential amplifier circuit. In a differential amplifier type ring oscillator PLL, to perform an oscillation with a phase shift (phase delay) of 90 degrees and a sufficient output gain, the parasitic capacitance of the circuit should be appropriately controlled. However, the control of parasitic capacitance has a limitation related to the Miller effect, and is difficult to precisely predict. A magnitude difference of two poles becomes greater by the Miller effect; thus, obtaining a sufficient phase shift is difficult.

In a more improved conventional design, the structure of FIG. 1 to solve problems caused in the ring oscillator realized by using differential amplifiers and to reduce current consumption and jitter generation, is well known in the field. FIG. 1 is a block diagram of a conventional ring oscillator, and FIG. 2 is a circuit diagram illustrating in detail a differential amplifier constituting a portion of the ring oscillator of FIG. 1.

As shown in FIG. 1, a conventional ring oscillator according to the prior art has a mutually cross-connected configuration of two stages including a first differential amplifier 31 and a second differential amplifier 32, in which a unit differential amplifier is configured as shown in FIG. 2. A load terminal of the differential amplifier is constructed of an active load that operates as an inductor by a frequency characteristic graph. In other words, an output terminal Vz and an output terminal Vzb of the first and second differential amplifiers 31 and 32 are cross coupled, and an output node Vob and an output node Vo are used as an output terminal operating as a low pass filter.

Referring to FIG. 2, a differential amplifier includes a first PMOS (P-channel Metal Oxide Semiconductor) transistor 41 for supplying power source voltage to a drain in response to a bias voltage Vbiasp applied through a gate; second and third PMOS transistors 42 and 43, of which sources are each connected to a drain of the first PMOS transistor 41, and which receive an input signal Vi and an input signal Vib at gates thereof; cross-coupled first-stage transistors 46 configured between a drain of the second PMOS transistor 42 and a ground terminal; a first oscillator Cz, 44 configured between an output node Vzb and a ground terminal; a resistance Rz configured between the output node Vzb and a cross-coupling node Vob; cross-coupled second-stage transistors 47 configured between a drain of the third PMOS transistor 43 and a ground terminal; a second oscillator Cz, 45 configured between an output node Vz and a ground terminal; and a resistance Rz configured between a node Vz and a cross-coupling node Vo.

In the circuit structure of the differential amplifier shown in FIG. 2, a phase shift of 90 degrees can be obtained regardless of the value of capacitance Cz. That is, in the circuit configuration of FIG. 1 where differential amplifiers of FIG. 2 are connected in two stages and an output terminal different from the existing output terminal is used in the mutually connected structure, the phase shift of 90 degrees necessary for an oscillation of ring oscillator can be obtained regardless of the size of the load transistor. Output gain is improved by using the cross-coupled transistor configuration that is added to prevent a reduction of the output gain. In the configuration of FIG. 2, the output terminal Vz, Vzb operates as a low pass filter to a variation in power supply; thus, jitter can be mitigated.

The configuration of FIG. 1 operates to overcome the limited oscillation condition of the two-stage ring oscillator, and has a modified structure in the output terminal so as to increase the phase shift level of the ring oscillator.

However, in the circuit of FIG. 2, resistance values of the resistors Rz between node Vzb and the cross-coupling node Vob and of the resistor Rz between node Vz and the cross coupling node Vo are fixed, thus the resonance frequency response is relatively small. Hence, the resonance lowest voltage is relatively high, and so it is difficult to ensure a resonance frequency response of a desired larger range in the ring oscillator.

Further, an externally applied power source voltage is used as the operating power source voltage; thus when the external power source voltage includes noise, jitter characteristics of the circuit can be adversely affected.

SUMMARY OF THE INVENTION

The present invention is directed to a VCO having two or more stages, in which the characteristics of low-power consumption and clock generation of a phase difference of over 90 degrees are provided in a manner that provides a wide resonance frequency range and a lower value of the low resonance voltage.

In one aspect, the present invention is directed to a differential amplifier circuit for use in a ring oscillator, comprising: first and second MOS(Metal Oxide Semiconductor) transistors to each source of which an operating power source voltage is applied, and which individually respond to first and second input signals with mutually contrary phases applied to gates thereof; cross-coupled first and second-stage transistors of which each drain-source channel is connected between each drain of the first and second MOS transistors and a ground voltage level; a first variable resistance, which is connected between a drain of the first MOS transistor cross-connected to a second gate of the cross-coupled second-stage transistors, and a first gate of the cross-coupled first-stage transistors, and which is controlled by the operating power source voltage applied to a gate thereof; and a second variable resistance, which is connected between a drain of the second MOS transistor cross-connected to a second gate of the cross-coupled first-stage transistors, and a first gate of the cross-coupled second-stage transistors, and which is controlled by the operating power source voltage applied to a gate thereof.

In one embodiment, the first and second variable resistances comprise N-type MOS transistors each having a resistance that is variable in response to the operating power source voltage.

In another embodiment, the operating power source voltage is generated from a feedback circuit, an input of which is an externally applied voltage.

In another embodiment, when the first and second MOS transistors are P-type MOS transistors, the first and second-stage transistors are N-type MOS transistors.

In another embodiment, the differential amplifier circuit further includes additional stages to function as a ring oscillator constructed of differential amplifiers of a cross-coupled type.

In another embodiment, the differential amplifier circuit further comprises an oscillator coupled between first gates of the cross-coupled first and second-stage transistors and the ground voltage level.

In another aspect, the present invention is directed to a differential amplifier circuit for use in a ring oscillator, comprising: first and second P-type MOS transistors, to each source of which an operating power source voltage is applied, and which individually respond to first and second input signals with mutually contrary phases applied to gates thereof; cross-coupled first-stage N-type transistors of which a drain-source channel is connected between a drain of the first P-type MOS transistor and a ground voltage level; cross-coupled second-stage N-type transistors of which a drain-source channel is connected between a drain of the second P-type MOS transistor and a ground voltage level; a first variable resistance, which is connected between a drain of the first P-type MOS transistor cross-connected to a second gate of the cross-coupled second-stage N-type transistors, and a first gate of the cross-coupled first-stage N-type transistors, and which is controlled by the operating power source voltage applied to a gate thereof; and a second variable resistance, which is connected between a drain of the second P-type MOS transistor cross-connected to a second gate of the cross-coupled first-stage N-type transistors, and a first gate of the cross-coupled second-stage N-type transistors, and which is controlled by the operating power source voltage applied to a gate thereof.

In one embodiment, the first and second variable resistances comprise N-type MOS transistors each having a resistance that is variable in response to the operating power source voltage.

In another embodiment, the operating power source voltage is generated from a feedback circuit, an input of which is an externally applied voltage In another embodiment, multiple differential amplifier circuits are provided to function as a ring oscillator of two or more stages constructed of cross-coupled type differential amplifiers.

In another aspect, the present invention is directed to a ring oscillator for use in a semiconductor memory device, the oscillator comprising a first differential amplifier and a second differential amplifier, the first differential amplifier including first and second P-type MOS transistors, to each source of which an operating power source voltage is applied, and which individually respond to first and second input signals with mutually contrary phases applied to gates thereof; cross-coupled first-stage N-type transistors of which a drain-source channel is connected between a drain of the first P-type MOS transistor and a ground voltage level; cross-coupled second-stage N-type transistors of which a drain-source channel is connected between a drain of the second P-type MOS transistor and a ground voltage level; a first variable resistance, which is connected between a drain of the first P-type MOS transistor cross-connected to a second gate of the cross-coupled second-stage N-type transistors, and a first gate of the cross-coupled first-stage N-type transistors, and which is controlled by the operating power source voltage applied to a gate thereof; and a second variable resistance, which is connected between a drain of the second P-type MOS transistor cross-connected to a second gate of the cross-coupled first-stage N-type transistors, and a first gate of the cross-coupled second-stage N-type transistors, and which is controlled by the operating power source voltage applied to a gate thereof, and the second differential amplifier including third and fourth P-type MOS transistors, to each source of which the operating power source voltage is applied, and of which each gate is connected to each first gate of the cross-coupled second and first-stage N-type transistors; cross-coupled third-stage N-type transistors of which a drain-source channel is connected between a drain of the third P-type MOS transistor and a ground voltage level; cross-coupled fourth-stage N-type transistors of which a drain-source channel is connected between a drain of the fourth P-type MOS transistor and a ground voltage level; a third variable resistance, which is connected between a drain of the third P-type MOS transistor cross-connected to a second gate of the cross-coupled fourth-stage N-type transistors, and a first gate of the cross-coupled third-stage N-type transistors, and which is controlled by the operating power source voltage applied to a gate thereof; and a fourth variable resistance, which is connected between a drain of the fourth P-type MOS transistor cross-connected to a second gate of the cross-coupled third-stage N-type transistors, and a first gate of the cross-coupled fourth-stage N-type transistors, and which is controlled by the operating power source voltage applied to a gate thereof.

In one embodiment, the first and second variable resistances comprise N-type MOS transistors of which gates receive the operating power source voltage.

In another embodiment, the operating power source voltage is an externally applied power source voltage, or is a voltage obtained by feeding back the operating power source voltage to a comparator that receives an externally applied voltage as an input.

In another embodiment, the ring oscillator is constructed of differential amplifiers of two or more stages of even number.

According to the present invention, the resistance is a variable resistance, and not a fixed resistance as in the conventional approach, the variable resistance being varied in response to the operating power source voltage. In this manner, a greater resonance frequency range can be ensured.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS OF THE INVENTION

The present invention will now be described more fully hereinafter with reference to FIG. 3, in which preferred embodiments of the invention are shown. This invention may, however, be embodied in different forms and should not be construed as limited to the embodiments set forth herein.

Figure 3:
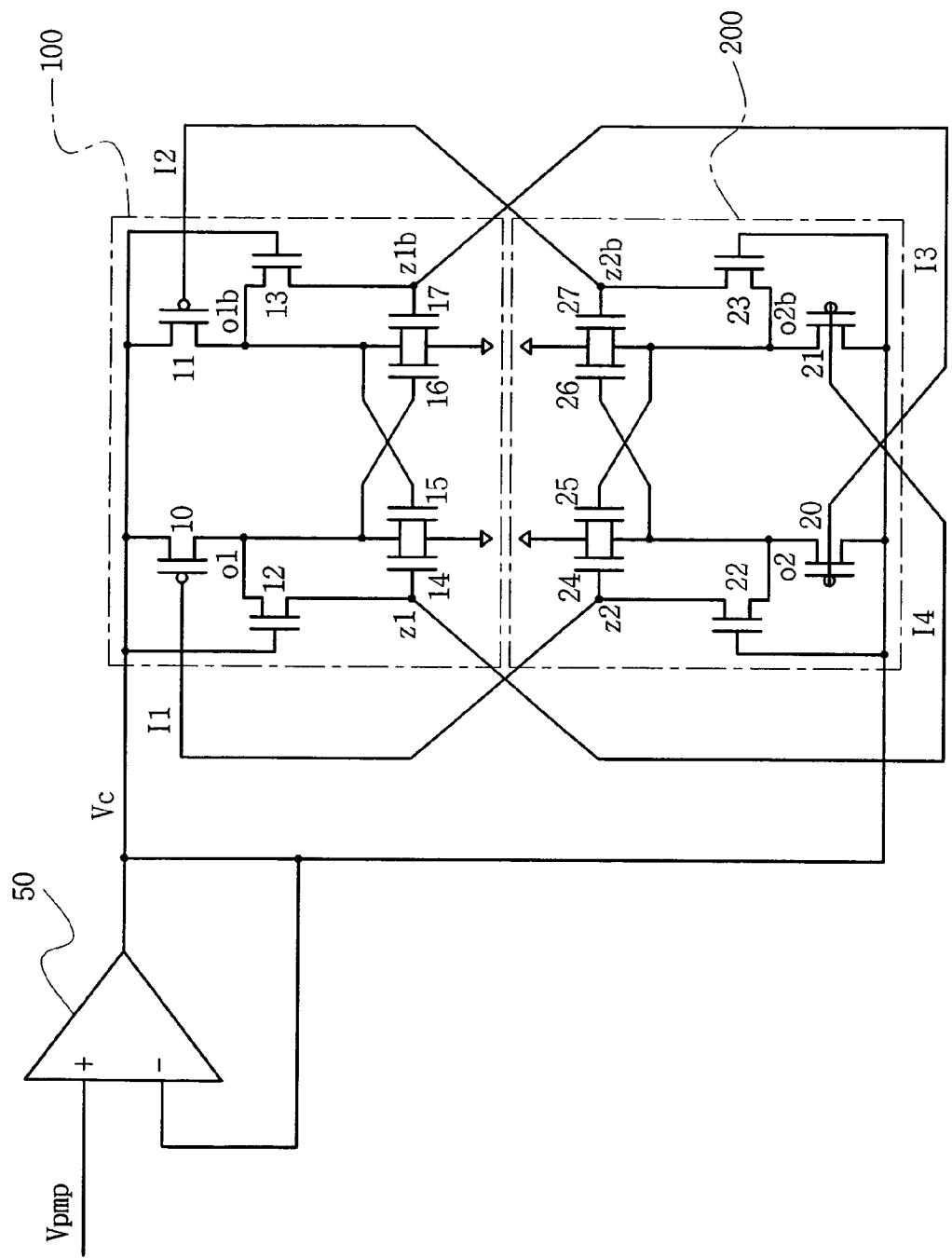
FIG. 3 is a circuit diagram of ring oscillator constructed of differential amplifiers according to an exemplary embodiment of the invention.

FIG. 3 is a circuit diagram of ring oscillator constructed of differential amplifiers according to an exemplary embodiment of the invention. Referring to FIG. 3, the ring oscillator includes a comparator 50 for generating an operating control voltage Vc in response to an externally applied voltage Vpmp, a first differential amplifier 100 and a second differential amplifier 200 having input/output terminals that are cross-connected with the first differential amplifier 100.

In detail, the first differential amplifier 100 includes first and second P-type MOS transistors 10 and 11, to each source of which an operating power source voltage Vc is applied in common, and which individually respond to first and second input signals 11, 12 applied with mutually complementary phases; cross-coupled first-stage N-type transistors 14 and 15 of which a drain-source channel is connected between a drain of the first P-type MOS transistor 10 and a ground voltage level; cross-coupled second-stage N-type transistors 16 and 17 of which a drain-source channel is connected between a drain of the second P-type MOS transistor 11 and a ground voltage level; a first variable resistance 12, which is connected between a drain of the first P-type MOS transistor 10 cross-connected to a second gate of the cross-coupled second-stage N-type transistors 16 and 17, and a first gate of the cross-coupled first-stage N-type transistors 14 and 15, and which is controlled at a gate thereof by the operating power source voltage Vc; and a second variable resistance 13, which is connected between a drain of the second P-type MOS transistor 11 cross-connected to a second gate of the cross-coupled first-stage N-type transistors 14 and 15, and a first gate of the cross-coupled second-stage N-type transistors 16 and 17, and which is controlled at a gate thereof by the operating power source voltage Vc.

The second differential amplifier 200 includes third and fourth P-type MOS transistors 20 and 21, to each source of which the operating power source voltage Vc is applied commonly, and of which each gate is connected to each first gate of the cross-coupled second and first-stage N-type transistors 16, 17 and 14, 15; cross-coupled third-stage N-type transistors 24 and 25 of which a drain-source channel is connected between a drain of the third P-type MOS transistor 20 and a ground voltage level; cross-coupled fourth-stage N-type transistors 26 and 27 of which a drain-source channel is connected between a drain of the fourth P-type MOS transistor 21 and a ground voltage level; a third variable resistance 22, which is connected between a drain of the third P-type MOS transistor 20 cross-connected to a second gate of the cross-coupled fourth-stage N-type transistors 26 and 27, and a first gate of the cross-coupled third-stage N-type transistors 24 and 25, and which is controlled at a gate thereof by the operating power source voltage Vc; and a fourth variable resistance 23, which is connected between a drain of the fourth P-type MOS transistor 21 cross-connected to a second gate of the cross-coupled third-stage N-type transistors 24 and 25, and a first gate of the cross-coupled fourth-stage N-type transistors 26 and 27, and which is controlled at a gate thereof by the operating power source voltage Vc.

Figure 2:
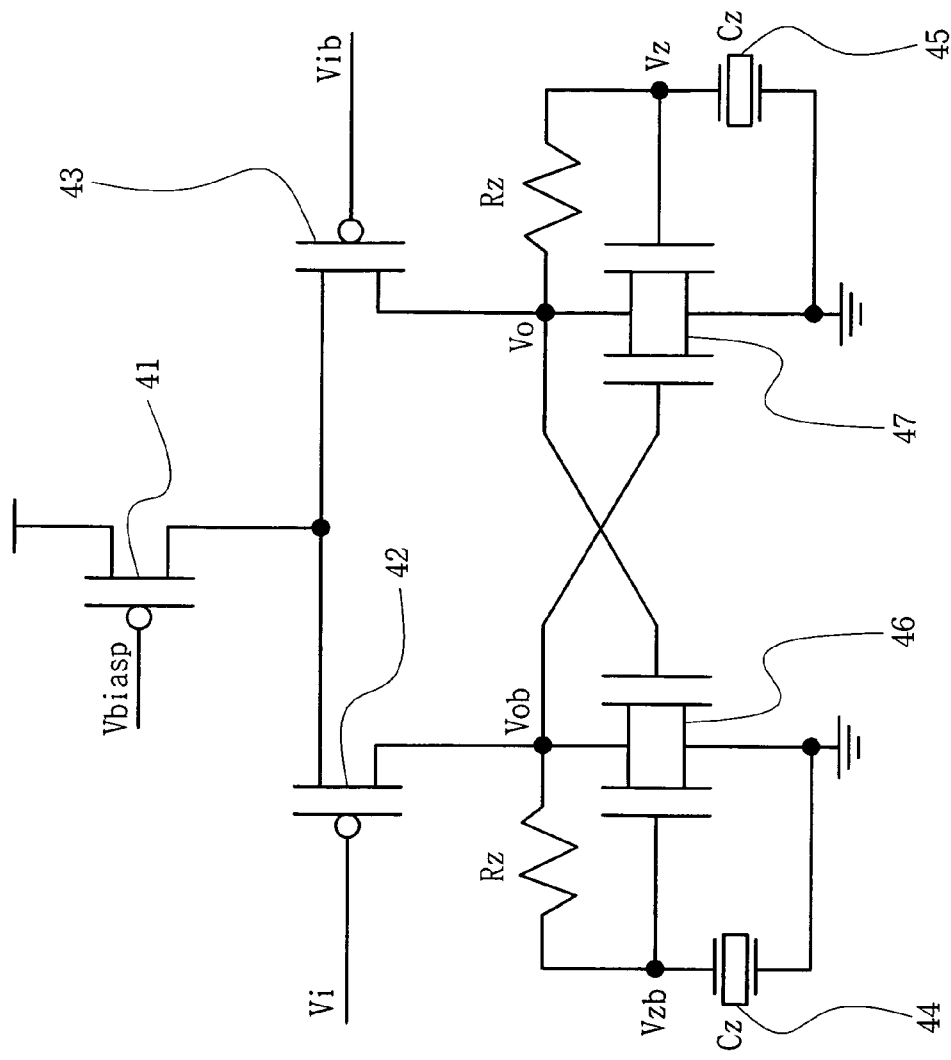
FIG. 2 is a circuit diagram illustrating in detail a differential amplifier of the conventional ring oscillator of FIG. 1.

In FIG. 3, the first to fourth variable resistances 12, 13, 22 and 23 are each constructed of an N-type MOS transistor, and each gate receives the operating control voltage Vc. Voltage levels of the output terminals o1, o1$b$, o2 and o2$b$ become variable depending upon the operating control voltage Vc, thus a resonance lowest voltage is relatively low as compared with the conventional oscillator including a fixed resistance, as shown in FIG. 2, that is, the resonance frequency range is relatively large as compared with the conventional oscillator of FIG. 2 including a fixed resistance. Consequently, by including a variable resistance value through the use of a MOS transistor 12, 13, 20, 21, a wider resonance frequency range for the VCO can be obtained.

Figure 1:
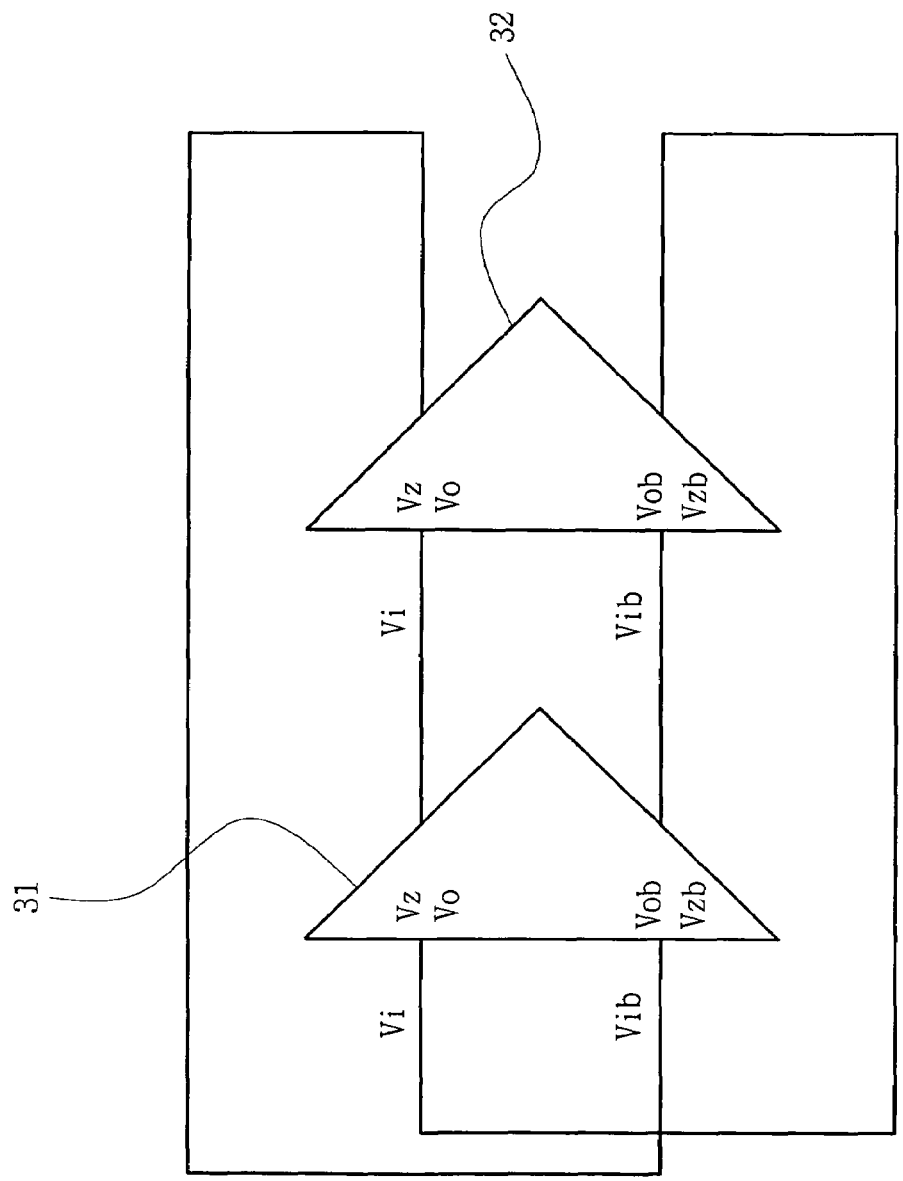
FIG. 1 is a block diagram of a conventional ring oscillator.

To substantially reduce the jitter problem caused by inherent noise in the power source voltage, an operating power source voltage Vc is applied that is obtained by feeding back the operating power source voltage Vc to the comparator 50, and not by applying an external power source voltage as in the configuration of FIG. 1. SPICE (Simulation Program with Integrated Circuit Emphasis) simulation results demonstrated significantly improved jitter characteristics in the circuit embodiment of FIG. 3, as compared with the conventional design of FIG. 2.

In alternative connection configurations of differential amplifiers of two or more stages in the ring oscillator of FIG. 3, the configuration of even-number stages is beneficial, and may be increased to 4, 6 and 8 stages that include a final output that is cross-fed back to an input.

In such a ring oscillator, an oscillator Cz referred to in FIG. 2 may be further connected between a first gate of the cross-coupled first through fourth stage transistors 14-17, 24-27 and the ground voltage level.

Operation of the circuit shown in FIG. 3 is substantially similar to the operation of the conventional oscillator shown in FIG. 2, with the exception of the improved resonance frequency range and the superior jitter characteristics. For example, when first and second input signals 11 and 12 applied to the first differential amplifier 100 each have logic 1 and logic 0, second P-type MOS transistor 11 is turned on, and first P-type MOS transistor 10 is turned off. The voltage level of output terminal o1$b$ begins to increase toward the level of operating control voltage Vc, and the voltage level of output terminal o1 begins to lower to the ground level, e.g., potential of 0V as the N-type transistor 15 is turned on. At the same time, third and fourth input signals 13 and 14 applied to the second differential amplifier 200 each become logic 1 and logic 0, thus outputs of the second differential amplifier 200 on the final stage each become logic 0 and logic 1. As this output is also cross-connected to an input of first stage, an input of first differential amplifier is inverted after a lapse of even number of delay periods NTd in a differential ring oscillator that is constructed of even-number of differential amplifiers.

In a differential amplifier constituting a ring oscillator according to an exemplary embodiment of the invention, a resistance value that is required as an element of the circuit comprises a variable resistance, rather than a fixed resistance as in the conventional embodiment. The variable resistance is varied in response to the operating power source voltage, thus the limitation in the resonance lowest voltage associated with the conventional configuration is addressed. Accordingly, the ring oscillator can ensure an enhanced resonance frequency range as compared with the conventional oscillator.

In addition, an operating power source voltage is obtained by feeding back the operating power source voltage to a comparator, and is therefore not a directly applied external power source voltage. Therefore, jitter characteristics of the device are markedly improved.

While this invention has been particularly shown and described with references to preferred embodiments thereof, it will be understood by those skilled in the art that various changes in form and details may be made herein without departing from the spirit and scope of the invention as defined by the appended claims. For example, the transistor type, the number of transistors, or the number of connected differential amplifiers may be changed.

What is claimed is:

1. A differential amplifier circuit for use in a ring oscillator, comprising:

first and second MOS(Metal Oxide Semiconductor) transistors to each source of which an operating power source voltage is applied, and which individually respond to first and second input signals with mutually contrary phases applied to gates thereof;

cross-coupled first and second-stage transistors of which each drain-source channel is connected between each drain of the first and second MOS transistors and a ground voltage level;

a first variable resistance, which is connected between a drain of the first MOS transistor cross-connected to a second gate of the cross-coupled second-stage transistors, and a first gate of the cross-coupled first-stage transistors, and which is controlled by the operating power source voltage applied to a gate thereof; and a second variable resistance, which is connected between a drain of the second MOS transistor cross-connected to a second gate of the cross-coupled first-stage transistors, and a first gate of the cross-coupled second-stage transistors, and which is controlled by the operating power source voltage applied to a gate thereof.

2. The circuit of claim 1, wherein the first and second variable resistances comprise N-type MOS transistors each having a resistance that is variable in response to the operating power source voltage.

3. The circuit of claim 1, wherein the operating power source voltage is generated from a feedback circuit, an input of which is an externally applied voltage.

4. The circuit of claim 1, wherein when the first and second MOS transistors are P-type MOS transistors, the first and second-stage transistors are N-type MOS transistors.

5. The circuit of claim 4, wherein the differential amplifier circuit further includes additional stages to function as a ring oscillator constructed of differential amplifiers of a cross-coupled type.

6. The circuit of claim 5, further comprising an oscillator coupled between first gates of the cross-coupled first and second-stage transistors and the ground voltage level.

7. A differential amplifier circuit for use in a ring oscillator, comprising:

first and second P-type MOS transistors, to each source of which an operating power source voltage is applied, and which individually respond to first and second input signals with mutually contrary phases applied to gates thereof;

cross-coupled first-stage N-type transistors of which a drain-source channel is connected between a drain of the first P-type MOS transistor and a ground voltage level;

cross-coupled second-stage N-type transistors of which a drain-source channel is connected between a drain of the second P-type MOS transistor and a ground voltage level;

a first variable resistance, which is connected between a drain of the first P-type MOS transistor cross-connected to a second gate of the cross-coupled second-stage N-type transistors, and a first gate of the cross-coupled first-stage N-type transistors, and which is controlled by the operating power source voltage applied to a gate thereof; and a second variable resistance, which is connected between a drain of the second P-type MOS transistor cross-connected to a second gate of the cross-coupled first-stage N-type transistors, and a first gate of the cross-coupled second-stage N-type transistors, and which is controlled by the operating power source voltage applied to a gate thereof.

8. The circuit of claim 7, wherein the first and second variable resistances comprise N-type MOS transistors each having a resistance that is variable in response to the operating power source voltage.

9. The circuit of claim 7, wherein the operating power source voltage is generated from a feedback circuit, an input of which is an externally applied voltage.

10. The circuit of claim 9, wherein multiple differential amplifier circuits are provided to function as a ring oscillator of two or more stages constructed of cross-coupled type differential amplifiers.

11. A ring oscillator for use in a semiconductor memory device, the oscillator comprising a first differential amplifier and a second differential amplifier, the first differential amplifier including first and second P-type MOS transistors, to each source of which an operating power source voltage is applied, and which individually respond to first and second input signals with mutually contrary phases applied to gates thereof; cross-coupled first-stage N-type transistors of which a drain-source channel is connected between a drain of the first P-type MOS transistor and a ground voltage level; cross-coupled second-stage N-type transistors of which a drain-source channel is connected between a drain of the second P-type MOS transistor and a ground voltage level; a first variable resistance, which is connected between a drain of the first P-type MOS transistor cross-connected to a second gate of the cross-coupled second-stage N-type transistors, and a first gate of the cross-coupled first-stage N-type transistors, and which is controlled by the operating power source voltage applied to a gate thereof; and a second variable resistance, which is connected between a drain of the second P-type MOS transistor cross-connected to a second gate of the cross-coupled first-stage N-type transistors, and a first gate of the cross-coupled second-stage N-type transistors, and which is controlled by the operating power source voltage applied to a gate thereof, and the second differential amplifier including third and fourth P-type MOS transistors, to each source of which the operating power source voltage is applied, and of which each gate is connected to each first gate of the cross-coupled second and first-stage N-type transistors; cross-coupled third-stage N-type transistors of which a drain-source channel is connected between a drain of the third P-type MOS transistor and a ground voltage level; cross-coupled fourth-stage N-type transistors of which a drain-source channel is connected between a drain of the fourth P-type MOS transistor and a ground voltage level; a third variable resistance, which is connected between a drain of the third P-type MOS transistor cross-connected to a second gate of the cross-coupled fourth-stage N-type transistors, and a first gate of the cross-coupled third-stage N-type transistors, and which is controlled by the operating power source voltage applied to a gate thereof; and a fourth variable resistance, which is connected between a drain of the fourth P-type MOS transistor cross-connected to a second gate of the cross-coupled third-stage N-type transistors, and a first gate of the cross-coupled fourth-stage N-type transistors, and which is controlled by the operating power source voltage applied to a gate thereof.

12. The oscillator of claim 11, wherein the first and second variable resistances comprise N-type MOS transistors of which gates receive the operating power source voltage.

13. The oscillator of claim 11, wherein the operating power source voltage is an externally applied power source voltage, or is a voltage obtained by feeding back the operating power source voltage to a comparator that receives an externally applied voltage as an input.

14. The oscillator of claim 13, wherein when the ring oscillator is constructed of differential amplifiers of two or more stages of even number.

* * * * *